United States Patent [19]

Pastor

[11] Patent Number: 4,687,538
[45] Date of Patent: Aug. 18, 1987

[54] METHOD FOR GROWING SINGLE CRYSTALS OF THERMALLY UNSTABLE FERROELECTRIC MATERIALS

[75] Inventor: Antonio C. Pastor, Santa Monica, Calif.

[73] Assignee: Hughes Aircraft Company, Los Angeles, Calif.

[21] Appl. No.: 841,407

[22] Filed: Mar. 19, 1986

Related U.S. Application Data

[63] Continuation-in-part of Ser. No. 722,588, Apr. 12, 1985, abandoned.

[51] Int. Cl.$^4$ .................. C30B 11/02; C30B 11/14
[52] U.S. Cl. .......................... 156/616 R; 156/624; 156/DIG. 63; 156/DIG. 81; 156/DIG. 71
[58] Field of Search .............. 156/616 R, 620, 624, 156/DIG. 63, DIG. 81, DIG. 71; 423/305, 307; 252/262.9 R

[56] References Cited

U.S. PATENT DOCUMENTS

| | | | |
|---|---|---|---|
| 3,607,137 | 9/1971 | Inoguchi et al. | 156/616 R |
| 3,653,432 | 4/1972 | Schmid et al. | 156/616 R |
| 3,949,323 | 4/1976 | Bierlein | 156/DIG. 81 |
| 4,521,272 | 6/1985 | Gault | 156/616 R |

OTHER PUBLICATIONS

Belouet, C., "Growth and Characterization of Single Crystals of KDP Family", vol. 3, 1981, pp. 121–156.
Gatos, H., "On the Selection of Methods for Crystal Growth", from Crystal Growth, A Tutorial Approach, vol. 2, pp. 1–16, 1979, Bardsley et al. Ed.

Primary Examiner—William R. Dixon, Jr.
Assistant Examiner—Robert Bruce Breneman
Attorney, Agent, or Firm—Wanda K. Denson-Low; A. W. Karambelas

[57] ABSTRACT

A method is disclosed for growing thermally unstable ferroelectric materials having the formula $MH_2XO_4$, where M is potassium, rubidium, cesium or ammonium; H is hydrogen or deuterium and X is phosphorus or arsenic. The ferroelectric material is heated to melt temperature in a constant volume cylindrical chamber (10) which is moisture-free. Improved crystal formation is accomplished by axially cooling the melt from the bottom end (18) of the chamber by thermal conduction along the chamber longitudinal axis predominantly and only minimally by radial thermal conduction through the sides (16) of the chamber. The axial cooling produces a crystal interface which is flat and perpendicular to the chamber axis and which gradually progresses toward the chamber top to provide uniform growth of a single crystal of ferroelectric material.

13 Claims, 13 Drawing Figures

METHOD FOR GROWING SINGLE CRYSTALS OF THERMALLY UNSTABLE FERROELECTRIC MATERIALS

This is a continuation-in-part application of my copending application Ser. No. 722,588, filed Apr. 12, 1985 now abandoned.

BACKGROUND OF THE INVENTION

The present invention relates generally to methods for growing single crystals of ferroelectric materials which are thermally unstable at temperatures below their melting points. More particularly, the present invention relates to growing single crystals from a melt of the ferroelectric material in a manner such that the material does not thermally decompose and so that a high quality crystal is produced.

Ferroelectric materials which are generally classified as belonging to the KDP family include the following compounds:
$KH_2PO_4$ (or KDP), $KD_2PO_4$ (or KD*P), $RbH_2PO_4$ (or RDP), $RbD_2PO_4$ (or RD*P), $CsH_2PO_4$, $CsD_2PO_4$, $(NH_4)H_2PO_4$ (or ADP), $(NH_4)D_2PO_4$ (or AD*P), $(NH_3D)H_2PO_4$, $(NH_3D)D_2PO_4$, $(NH_2D_2)H_2PO_4$, $(NH_2D_2)D_2PO_4$, $(NHD_3)H_2PO_4$, $(NHD_3)D_2PO_4$, $(ND_4)H_2PO_4$, $(ND_4)D_2PO_4$, $KH_2AsO_4$, $KD_2AsO_4$, $RbH_2AsO_4$ (or RDA), $RbD_2AsO_4$, $CsH_2AsO_4$ (or CDA), $CsD_2AsO_4$ (or CD*A), $(NH_4)H_2AsO_4$ (or ADA), $(NH_4)D_2AsO_4$ (or AD*A), $(NH_3D)H_2AsO_4$, $(NH_3D)D_2AsO_4$, $(NH_2D_2)D_2AsO_4$, $(NH_2D_2)D_2AsO_4$, $(NHD_3)H_2AsO_4$, $(NHD_3)D_2AsO_4$, $(ND_4)H_2AsO_4$, $(ND_4)D_2AsO_4$ and mixtures of these.

Compounds such as $KHDPO_4$, $(NH_4)HDPO_4$, etc. or mixtures of deuterated and undeuterated counterparts are also considered part of the KDP family. Single crystals made from these materials are known to have good non-linear optical properties and are, therefore, used extensively in the electro-optical industries.

The above-listed ferroelectric materials which belong to the KDP family are notoriously thermally unstable at temperatures below their melting points. Typically, the materials undergo partial decomposition as they are heated to temperatures near their melting point. Due to this thermal instability, conventional high temperature crystal growth methods, such as the Czochralski and Bridgman techniques where crystals are grown from their respective melts, have not been developed. Instead, the crystals are grown at much lower temperatures from aqueous solutions by solvent evaporation.

The solvent evaporation method is the conventional procedure used in large-scale production of these crystals. This method is a slow process, with growth rates on the order of one millimeter per day being typical. The quality of the crystals grown by evaporation from solution suffers from microscopic solvent inclusions. Further, some optical and electro-optical properties of the crystals grown from solution will vary depending upon the amounts of potassium carbonate ($K_2CO_3$) and/or phosphoric acid ($H_3PO_4$) additives added to the growth solutions. These additives are conventionally used in different amounts by various commercial manufacturers to control solution pH and enhance crystal growth.

It would be desirable to provide a relatively quick method for preparing quality crystals from materials belonging to the KDP family which does not involve the relatively slow growth of crystals from aqueous solutions. It would further be desirable to provide a method which produces crystals having uniform optic and electro-optic properties and which do not have microscopic solvent inclusions.

SUMMARY OF THE INVENTION

In accordance with the present invention, a method is provided which allows relatively rapid and simple growth of high quality crystals from ferroelectric materials of the KDP family. The method is based on the growth of temperature-sensitive KDP-type materials from a melt of the material in a manner which prevents thermal decomposition and produces a high quality crystal having uniform and reproducible optic and electro-optic properties. The method has application to growing single crystals of ferroelectric materials having the formula $MH_2XO_4$, where M is potassium, rubidium, cesium or ammonium; H is hydrogen or deuterium and X is phosphorus or arsenic.

The method involves providing a sealed vessel which defines a constant volume cylindrical chamber having a top end, side walls and a bottom end. Except for $KH_2PO_4$, the chamber is substantially filled with the ferroelectric material to be processed into a single crystal and is also moisture-free. The chamber has an axis extending longitudinally from the chamber top end to the chamber bottom end. The ferroelectric material in the chamber is uniformly heated to a sufficient temperature to uniformly melt the material only and not decompose the material. The use of a constant volume sealed chamber limits the extent of decomposition of the material when melted.

The melted material is then axially cooled to form a single solid crystal. The axial cooling is accomplished from the bottom end of the chamber by thermal conduction along the chamber axis, rather than by radial thermal conduction through the vessel side walls. This axial-only cooling produces a crystal interface between the solid crystal material and the melted material which is flat and perpendicular to the chamber axis. The crystal interface progresses from the chamber bottom end to the chamber top end due to the axial-only cooling and thereby provides uniform growth of the single crystal from the bottom end to the top end of the chamber.

The method in accordance with the present invention provides a simple and relatively fast means for reproducibly and accurately growing high quality crystals from thermally unstable ferroelectric materials. The new method is an improvement over the slower solution type crystal growth methods presently in use which produce crystals having solvent inclusions and varying properties.

The above discussed and many other features and attendant advantages of the present invention will become better understood by reference to the following detailed description when considered in conjunction with the accompanying drawings.

DETAILED DESCRIPTION OF THE INVENTION

Figure 1A:
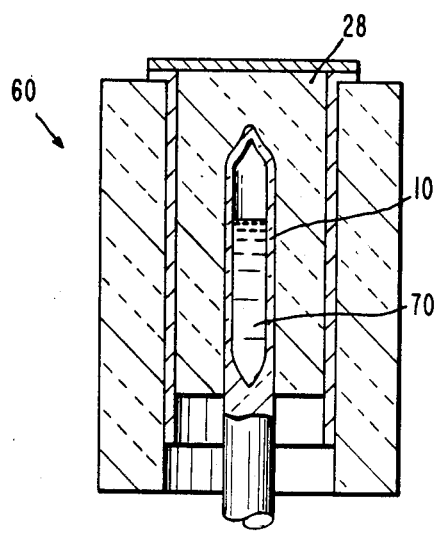
FIG. 1 is a partial schematic representation showing the steps of uniformly heating the ferroelectric material and axially cooling the material by downward movement of the crucible.

The present invention relates to growing high quality single crystals from compounds in the KDP family. For the purposes of this specification, the KDP family will be defined as those ferroelectric materials having the formula $MH_2XO_4$, where M is potassium, rubidium, cesium or ammonium; H is hydrogen or deuterium and X is phosphorus or arsenic. The ammonium may be partially or fully deuterated.

The KDP family of compounds includes $KH_2PO_4$ (KDP), $(NH_4)H_2PO_4$ (ADP), $RbH_2PO_4$, $CsH_2PO_4$, their corresponding arsenates and the fully and partially deuterated forms of the phosphates and arsenates as set forth in the Background of the Invention.

The ferroelectric materials collectively known as the KDP family are thermally unstable at or near their melting temperatures. When heated to melting, these materials will decompose according to the chemical reaction:

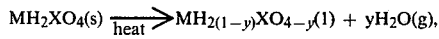
$$MH_2XO_4(s) \xrightarrow{heat} MH_{2(1-y)}XO_{4-y}(l) + yH_2O(g),$$

where y is a positive number not greater than 1 and is a measure of the extent of thermal decomposition of the ferroelectric material. If the material is heated in open air, so that the water vapor, $H_2O(g)$, is continuously removed from the reaction site, then the thermal decomposition will proceed to the point where only trace amounts of constitutioned water remain in the melt, i.e., y is almost equal to 1.

It was found that if the same starting material was heated to melting in a sealed chamber, its thermal decomposition did not proceed to the same extent as it did in open air. The extent of decomposition decreased as the volume of the reaction chamber was diminished. If the vapor space in the reaction chamber was reduced to the point where its volume was equal to that of the molten mass, it was found that the extent of decomposition was negligible, with y being less than about 0.01. At such low values of y, it was discovered that the material behaved like a congruent melter, i.e., like a material that melted or crystallized reversibly at its melting point.

In accordance with the present invention, high quality uniform crystals of KDP family materials except for KDP itself can be grown from their melts in a sealed or constant-volume vessel, if the vessel has the following features: (1) it must have minimal vapor space, or volume at most equal to the volume of the melt, (2) it must be provided with a nucleation, or seeding, end at which crystal growth may be initiated, and (3) it must be designed to allow for unidirectional cooling, starting from the nucleation end. In the case of KDP, the vapor space should be from about two-thirds to five-sixths of the constant-volume vessel.

Two preferred exemplary vessels which may be used in the method of the present invention are shown in FIGS. 3 and 4. Both FIGS. 3 and 4 show the vessel at four stages (A, B, C, and D) during preparation of the sealed vessel prior to heating. Referring to FIG. 3, a first exemplary embodiment is shown in which a cylindrical vial 10 is made from vitreous silica or other suitable material. The vial 10 is preferably formed in the end of a cylindrical rod. The vial 10 defines a cylindrical chamber 12 which has a top end 14, side walls 16 and bottom end 18. The bottom end 18 preferably tapers inward to point 20 to provide a suitable location for initiation of crystal growth.

Crystal growth may be initiated in either of two ways. The first is referred to as spontaneous nucleation. To achieve spontaneous nucleation, the crucible is designed in such a way that only one crystallite nucleus can form where crystal growth is to be initiated. Preferred designs of the crucible bottoms for spontaneous nucleation are shown in FIGS. 3 and 4 at 18 and 44, respectively, and in FIG. 5 at 45. The conical bottoms 18 and 44 have been used because they are simpler to fabricate. Since the bottom comes to a point, only one nucleus can form there. The design shown in FIG. 5 permits several nuclei to form in the bottom 47. However, only that nucleus which is favorably oriented (i.e., whose fastest growing direction is parallel to the vertical axis of the nucleating well 49) will emerge from the nucleating well 49, shutting off the other nuclei from the supply of nutrient material, viz., the melt.

Figure 5:
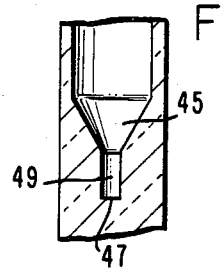
FIG. 5 is a partial sectional view of a preferred exemplary crucible design for initiating crystal growth.

The second way to initiate growth is by seeding, in which a seed crystal is placed at the growth initiation site. The same designs of crucible bottom discussed may be used for seeded growth. Since the seed crystal has to be cut to a shape that will fit the crucible bottom, the design shown in FIG. 5 is preferred. Many times it is desirable to grow crystals with a specific crystallographic orientation. Seeded growth provides this orientation control. Seeded growth has been utilized in crucibles having the bottom design of FIG. 5 to grow ADP crystals with controlled crystal orientation.

Vials made from silica glass are not quite inert to molten KDP. They are attacked by the melt, and this chemical action alters the melt composition, making the crystallization of KDP from it difficult. There is also a problem in growing ADP in silica glass, i.e., the problem of adhesion. The ADP crystal contracts more than does the silica glass crucible as they are cooled down to room temperature. Since the ADP cyrstal adheres to the crucible wall, it is subjected to tension during this cooling, and fractures as a result. In order to solve the corrosion problem with KDP and the adhesion problem with ADP, it is preferred that the interior of the silica glass crucible be lined with a carbon film. This carbon film is conveniently deposited on the silica glass surface by baking the crucible in a furnace at about 800° C. while a stream of acetone vapor and nitrogen is caused to flow in the crucible. This method of deposition of pyrolytic carbon on silica glass has been used in the past for crystal growth of cadmium telluride. Stainless steel crucibles that are electroplated with gold on the interior walls may also be used to grow crystals in accordance with the present invention.

Prior to sealing, the vial 10 includes a neck portion 22 which defines opening 24. The ferroelectric material to be processed is introduced into chamber 12 through opening 24. The chamber 12 is substantially completely filled with the ferroelectric material as shown at 26 in FIG. 3B. The ferroelectric material which is introduced into chamber 12 may be in particulate form. The particles should be small enough so that they are easily handled and introduced through opening 24, while not being so small that they are entrained when the vacuum is applied to the vial 10 when it is sealed.

Figure 3A:
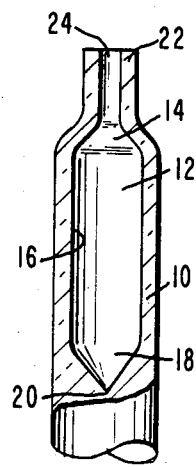
FIG. 3 depicts a first exemplary preferred method for providing a sealed vessel which is substantially full of the ferroelectric material to be processed in accordance with the present invention.
Figure 3B:
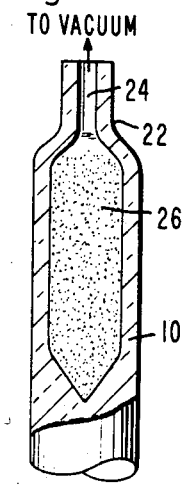

Prior to sealing vial 10, it is preferred that a vacuum be applied to the chamber 12 as represented in FIG. 3B, in order to remove any moisture present in chamber 12. The amount of vacuum which is applied to chamber 12 is not particularly critical so long as substantially all of the moisture present in chamber 12 is removed prior to sealing. A vacuum on the order of 5 Torr is acceptable. Also, the material may be slightly heated in order to ensure complete moisture removal.

Figure 3C:
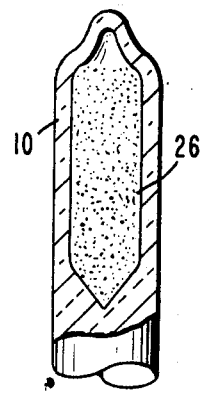

After substantially all of the moisture has been removed from chamber 12, the neck 22 is sealed as shown in FIG. 3C. Sealing of neck 22 is preferably accomplished by heating the neck to a sufficient temperature to melt the vitreous silica and provide a heat seal. Other possible methods for sealing the neck 22 can be used so long as the seal is sufficiently tight to maintain the vacuum and provide a constant volume cylindrical chamber.

Figure 3D:
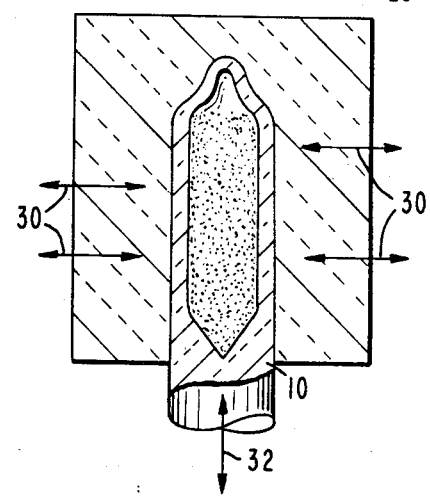

After sealing, the vial 10 is placed within an insulated housing 28 as shown in FIG. 3D. The insulated housing 28 must be made from a suitable insulating material and must also be of sufficient thickness to minimize radial thermal conduction in the direction represented by arrows 30. It is important that thermal conduction be predominantly axial in the direction represented by arrow 32. The insulation used for housing 28 may be any suitable insulating material such as asbestos or other low thermal conduction material. The diameter of the cylindrical chamber 12 can be varied depending upon the size of crystal to be grown. Typical crystal diameters are from about 0.5 inch to 1.5 inch.

Referring now to FIG. 4, a second exemplary vial 40 for growing crystals in accordance with the present invention is shown. The vial 40 is also preferably formed in the end of a cylindrical vitreous silica rod and includes sidewalls 42, tapered bottom 44 and an open top 46. The interior walls of the vial 40 are also preferably carbon lined. The open top 46 provides a much larger opening through which the ferroelectric material may be introduced into the chamber 48. In addition to a particulate charge of materials, charge material that is powder which is compressed into pellet form may be placed into chamber 48. Although the charge material may be in particulate form, it is preferred that the charge material be in the form of pressed tablets. The particulate, or powder, form has approximately half the density of the bulk solid form. Therefore, when it is melted down in the sealed crucible, at least half of the interior volume of the crucible is vapor space, the other half being occupied by the melt. This volume ratio is acceptable; however, it is preferred that the powder be pressed into tablets with density approximately that of the bulk solid and with diameter just less than the internal diameter of the crucible. The pellet may be inserted directly into the crucible or vial 40. In practice, the conical bottom 44 of the crucible may be filled with powder, then the pressed tablets may be stacked over it. The value of y can be reduced to as low as 0.0001 with this technique. Also, by using compressed powder pellets, the possibility of entrainment of charge materials during removal of moisture by vacuum is eliminated.

Figure 4A:
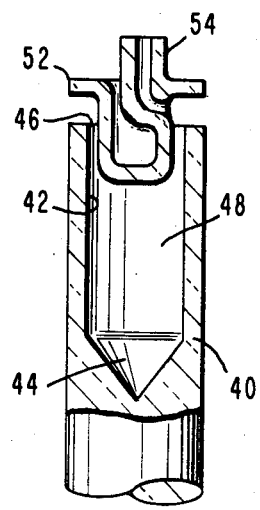
FIG. 4 depicts a second exemplary method for providing a sealed vessel which is substantially full of the ferroelectric material in accordance with the present invention.
Figure 4B:
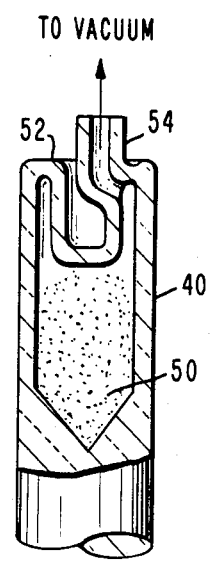
Figure 4C:
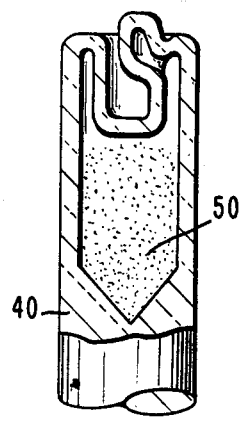
Figure 4D:
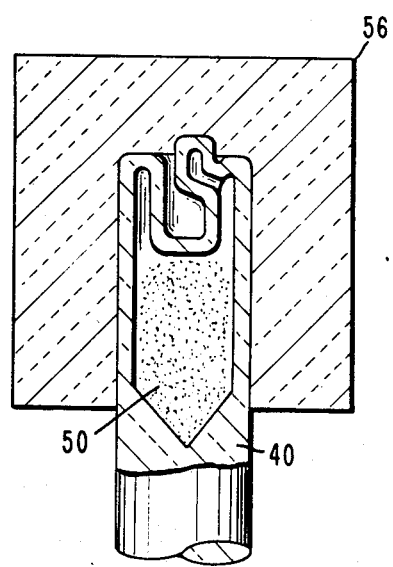

The chamber 40 is filled with the ferroelectric material 50 which is to be processed as shown in FIG. 4B. A plug 52 is inserted into the vial open top 46 and sealed to the vial 40 as also shown in FIG. 4B. The plug 52 includes a vacuum outlet 54 which is adapted to be attached to a vacuum to provide removal of moisture from the ferroelectric material 50. After the chamber 48 has been evacuated to remove substantially all of the moisture from the ferroelectric material 50, the outlet 54 is sealed off as shown in FIG. 4C. Again, sealing is preferably accomplished by melting the vitreous silica material to provide an air-tight seal. The sealed vial 40 is then placed in an insulating jacket 56 which is basically the same as the insulating jacket 28 previously described.

The following description will be limited to a discussion of crystal growth in accordance with the present invention utilizing the vial shown in FIG. 3. The description applies equally to the alternate vial configuration shown in FIG. 4.

Figure 2:
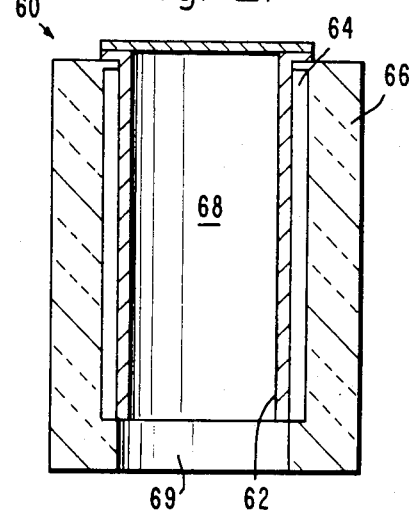
FIG. 2 is a sectional view of a preferred cylindrical furnace in accordance with the present invention.

After the vial 10 is sealed and placed within the insulating housing 28, it is first necessary to heat the KDP-family material 26 to a sufficient temperature to form a uniform melt of material. A preferred exemplary furnace for heating the insulated vial is shown generally at 60 in FIG. 2. It is important that the furnace 60 be designed so that the KDP-family material 26 is uniformly heated. If there are hot spots in the furnace, local overheating of the ferroelectric material may result. The localized overheating can cause localized decomposition of the material. Such localized decomposition may result in bursting of the vial. Even if bursting of the vial does not occur, the melt composition would nevertheless undesirably deviate farther than necessary from the starting composition. Such deviations would require that crystal growth be slowed down. The furnace 60 includes an anodized cylindrical aluminum sleeve lining 62. The aluminum sleeve lining ensures that the temperature in the furnace is uniform. A conventional cylindrical heating element 64 is located around the aluminum sleeve 62 to provide sufficient heat to melt the ferroelectric material. Insulation sleeve 66 is provided to allow accurate control of temperature within the heating chamber 68 and to prevent undesirable conduction of heat to the surrounding atmosphere. The sleeve 62 may be made from metals other than aluminum, so long as the metal is a good conductor of heat.

Figure 1B:
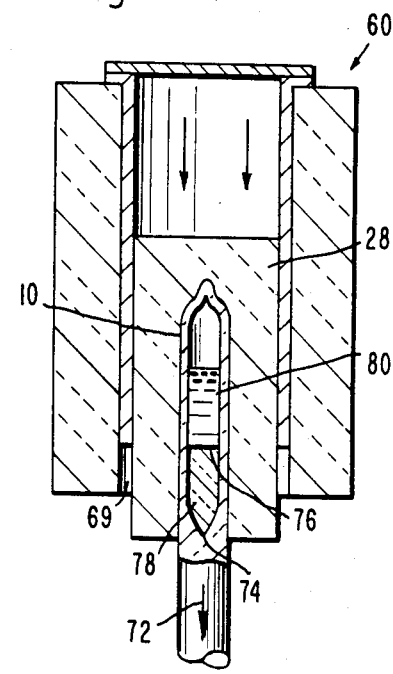

The steps of uniformly heating and axially cooling the KDP-family material in accordance with the present invention are shown in FIG. 1 and labeled as A, B and C. In step A, the material is shown after it has been heated in furnace 60 to a sufficient temperature to form a melt 70 of the ferroelectric material. The particular temperature to which the melt must be heated will vary depending upon the particular KDP-family material being processed. Preferably, the temperature of the melt will be about 10° C. to 15° C. above the melting point of the material. Melting points for KDP-family materials typically range from about 200° C. to about 300° C. For example, ADP has a melting point of about 200° C., while KDP has a melting point of about 270° C.

After the melt 70 has reached the desired uniform temperature, the vial 10 and insulated housing 28 are slowly withdrawn from the bottom 69 of the furnace 60. The rate at which the vial 10 is withdrawn from the furnace will vary, depending upon the particular ferroelectric material being crystallized and the crosssectional diameter of the melt. In general, withdrawal rates of up to about 2 millimeters per hour have been applied successfully, and it is believed that growth rates up to at least about 4 mm/hr are possible. However, slower rates are needed with KDP itself, from about 0.1 mm to about 0.7 mm per hour.

Figure 1C:
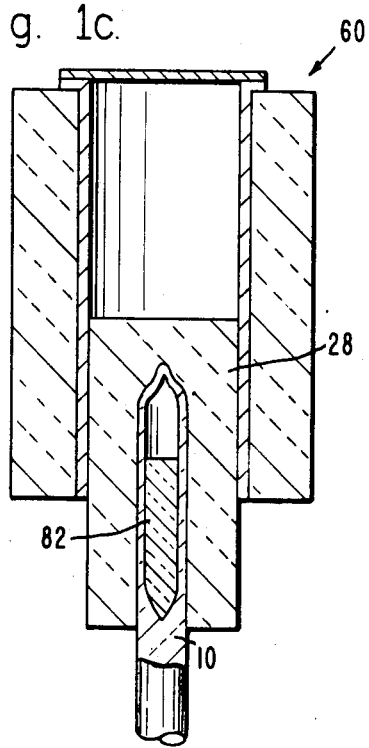

As the vial 10 and insulated housing 28 are withdrawn from furnace 60, the melt cools by axial thermal conduction as represented by arrow 72. The tapered bottom of the chamber allows the formation of a small seed crystal at point 74 from which the single ferroelectric crystal is grown. The axial-only cooling provided by this particular configuration produces a crystal interface 76 between the ferroelectric crystal 78 and melt 80. The interface 76 is flat and perpendicular to the axis of the chamber 12. The rate of withdrawal or pulling of the vial from furnace 60 is controlled so that the axial-only cooling produces the desired flat interface only and does not produce a concave or convex interface in which undesirable nuclei may form. The crystal interface progresses from the bottom end of the chamber to the top end of the chamber as the vial is slowly pulled from the furnace 60. FIG. 1C shows the final crystallized melt 82 which is formed after complete axial cooling and crystallization of the melt.

It is preferable that the insulated housing 28 fit tightly within the furnace chamber 68. The absence of an air space between the insulated housing 28 and aluminum sleeve 62 prevents air convection alongside the vial and provides the thermal stability which is essential to the crystal growth process.

The crystal growth process in accordance with the present invention has been used to grow high quality crystals of ADP. ADP, KDP, $CsH_2AsO_4$, $RbH_2AsO_4$ and $(ND_4)D_2PO_4$ are particularly preferred materials which are amenable to crystal growth utilizing the present invention. The crystal phase for KDP and ADP at room temperature belongs to the non-centro symmetrical point group $\overline{4}2$ m. In addition the process may be used to grow crystals which have been doped with about 2% to about 5% of any other member of the KDP family. This effectively reduces the melting temperature of the basic member and facilitates growth of crystals. We have also found that the arsenates crystals are easier to process and that the process may be used to process binary mixture of the KDP family, e.g., two phosphate compounds, two arsenate compounds or a mixture of a phosphate and arsenate.

The crystal growth method in accordance with the present invention provides an improved method for growing single crystals of thermally unstable ferroelectric material which is based on modifications of the Bridgman crystal growth technique. Due to the combined features of heating within a constant volume, moisture-free melt chamber, along with the provision for axial-only cooling during crystal formation, the present method provides a simple and efficient method for growing ferroelectric materials which is significantly faster than the prior solution growth techniques. Further, the quality of the crystals obtained are equal to or better than crystals formed by the solution growth techniques.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the specific embodiments as illustrated herein, but is only limited by the following claims.

What is claimed is:

1. A method for growing a single crystal of a ferroelectric material selected from the group consisting of ferroelectric materials having the formula $MH_2XO_4$, where M is rubidium, cesium or ammonium; H is hydrogen or deuterium and X is phosphorus or arsenic, said method comprising the steps of:

providing a sealed vessel which defines a constant volume cylindrical chamber having a top end, side walls and a bottom end, said chamber being substantially full of said ferroelectric material and moisture-free, said chamber having an axis extending longitudinally from the chamber top end to the chamber bottom end;

uniformly heating said ferroelectric material in said chamber to a sufficient temperature to uniformly melt said material only and not decompose said material;

providing a seed or nucleation point at the end where crystal growth is initiated; and axially cooling said material to form a single solid crystal, said axial cooling being accomplished from the bottom end of said chamber by thermal conduction along the chamber axis predominantly and only minimally by radial thermal conduction through the vessel side walls, said axial cooling producing a crystal interface between said solid crystal material and melted material which is flat and perpendicular to said chamber axis, said crystal interface progressing from said chamber bottom end to said chamber top end due to said axial cooling to thereby provide uniform growth of said single crystal from the bottom end to the top end of said chamber.

2. The method for growing a single crystal of ferroelectric material according to claim 2 wherein the crystal is grown from material where H is deuterium.

3. The method for growing a single crystal of ferroelectric material according to claim 1 wherein the crystal is grown from material where M is ammonium.

4. The method for growing a single crystal of ferroelectric material according to claim 5 wherein said ammonium is partially or fully deuterated.

5. The method for growing a single crystal of ferroelectric material according to claim 1 including the further step of removing said single crystal from said chamber.

6. The method for growing a single crystal of ferroelectric material according to claim 1 wherein:
   substantially all of the moisture is removed from said chamber before sealing; and
   sealing the top end of said vessel.

7. The method for growing a single crystal of ferroelectric material according to claim 1 wherein said ferroelectric material is heated to approximately 10° to 15° C. above the melting point of said ferroelectric material.

8. The method for growing a single crystal of ferroelectric material according to claim 1 wherein moisture is removed from said chamber by applying a vacuum to said chamber prior to sealing.

9. The method for growing a single crystal of ferroelectric material according to claim 1 wherein axial cooling of said material is provided by insulating said vessel side walls and top to prevent thermal conduction therethrough.

10. The method for growing a single crystal of ferroelectric material according to claim 1 wherein heating of said ferroelectric material is carried out in a furnace having a closed top, side walls and an open bottom defining a heating zone, said axial cooling of said ferroelectric material including the step of slowly withdrawing the bottom end of said vessel from the open bottom end of said heating zone.

11. The method for growing a single crystal of ferroelectric material according to claim 1 wherein said vessel bottom end includes a reduced diameter portion for initiating growth of said crystal.

12. A method for growing a single crystal of $KH_2XO_4$ wherein H is hydrogen or deuterium and X is phosphorus, said method comprising the steps of:

providing a sealed vessel which defines a constant volume cylindrical chamber having a top end, side walls and a bottom end, said chamber from about one-sixth to about one-third full of said $KH_2XO_4$ and moisture-free, said chamber having an axis extending longitudinally from the chamber top end to the chamber bottom end;

uniformly heating said $KH_2XO_4$ in said chamber to a sufficient temperature to uniformly melt said material only and not decompose said material; providing a seed or nucleation point at the end where crystal growth is initiated; and axially cooling said material to form a single solid crystal, said axial cooling being accomplished from the bottom end of said chamber by thermal conduction along the chamber axis predominantly and only minimally by radial thermal conduction through the vessel side walls, said axial cooling producing a crystal interface between said solid crystal material and melted material which is flat and perpendicular to said chamber axis, said crystal interface progressing from said chamber bottom end to said chamber top end due to said axial cooling at a rate from about 0.1 mm to about 0.7 mm per hour to thereby provide uniform growth of said single crystal from the bottom end to the top end of said chamber.

13. A method for growing a single crystal of $KH_2XO_4$ according to claim 12 wherein said $KH_2XO_4$ is $KH_2PO_4$.

* * * * *